(12) United States Patent
Lee et al.

(10) Patent No.: US 7,651,883 B2
(45) Date of Patent: Jan. 26, 2010

(54) HIGH ENERGY IMPLANT PHOTODIODE STACK

(75) Inventors: Jong-Jan Lee, Camas, WA (US); Douglas J. Tweet, Camas, WA (US); Sheng Teng Hsu, Camas, WA (US)

(73) Assignee: Sharp Laboratories of America, Inc., Camas, WA (US)

(*) Notice: Subject to any disclaimer, the term of this patent is extended or adjusted under 35 U.S.C. 154(b) by 239 days.

(21) Appl. No.: 11/801,320

(22) Filed: May 9, 2007

(65) Prior Publication Data

US 2008/0277701 A1    Nov. 13, 2008

(51) Int. Cl.
*H01L 21/00* (2006.01)
(52) U.S. Cl. .......... 438/66; 438/74; 257/E21.537; 257/E21.632
(58) Field of Classification Search .......... 257/446, 257/E21.537, E21.632; 438/66, 74
See application file for complete search history.

(56) References Cited

U.S. PATENT DOCUMENTS

| | | | |
|---|---|---|---|
| 5,422,299 A * | 6/1995 | Neudeck et al. ............ | 438/360 |
| 5,637,892 A * | 6/1997 | Leach ........................ | 257/362 |
| 6,727,521 B2 | 4/2004 | Merrill ........................ | 257/98 |
| 6,934,050 B2 | 8/2005 | Merrill et al. ............... | 358/1.16 |
| 6,960,757 B2 | 11/2005 | Merrill et al. ............... | 250/226 |
| 7,132,724 B1 | 11/2006 | Merrill ........................ | 257/440 |

* cited by examiner

Primary Examiner—Ngan Ngo
(74) Attorney, Agent, or Firm—Law Office of Gerald Maliszewski; Gerald Maliszewski

(57) ABSTRACT

An array of fully isolated multi-junction complimentary metal-oxide-semiconductor (CMOS) filterless color imager cells is provided, with a corresponding fabrication process. The color imager cell array is formed from a bulk silicon (Si) substrate without an overlying epitaxial Si layer. A plurality of color imager cells are formed in the bulk Si substrate, where each color imager cell includes a photodiode set and a U-shaped well liner. The photodiode set includes first, second, and third photodiode formed as a stacked multi-junction structure, while the U-shaped well liner fully isolates the photodiode set from adjacent photodiode sets in the array. The U-shaped well liner includes a physically interfacing doped well liner bottom and first wall. The well liner bottom is interposed between the substrate and the photodiode set, and the first wall physically interfaces each doped layer of each photodiode in the photodiode set.

16 Claims, 10 Drawing Sheets

Fig. 1
*(PRIOR ART)*
Fig. 2
*(PRIOR ART)*
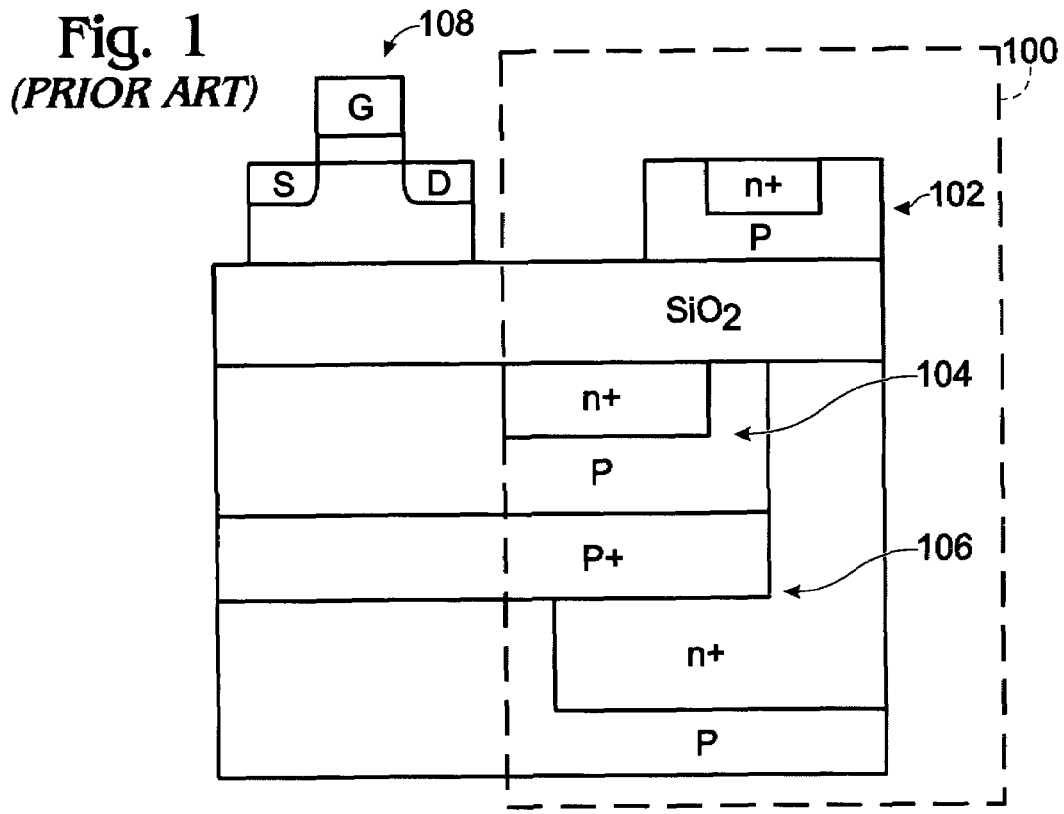
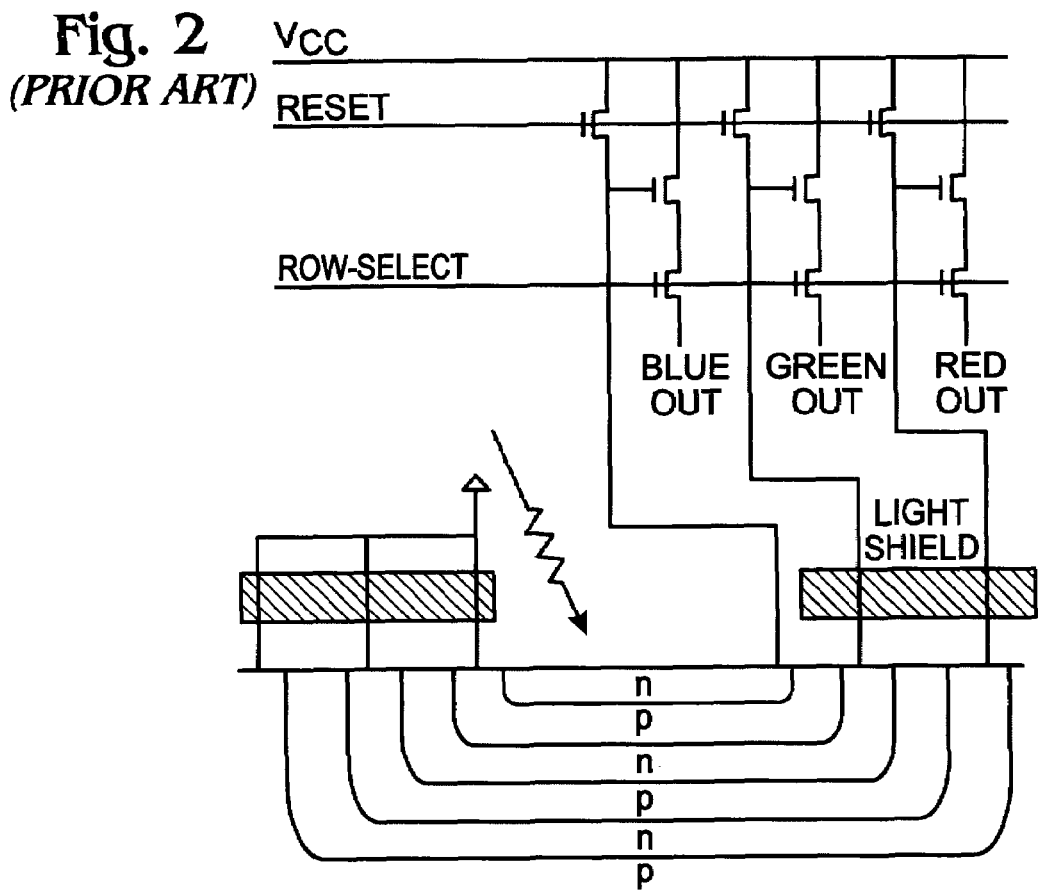

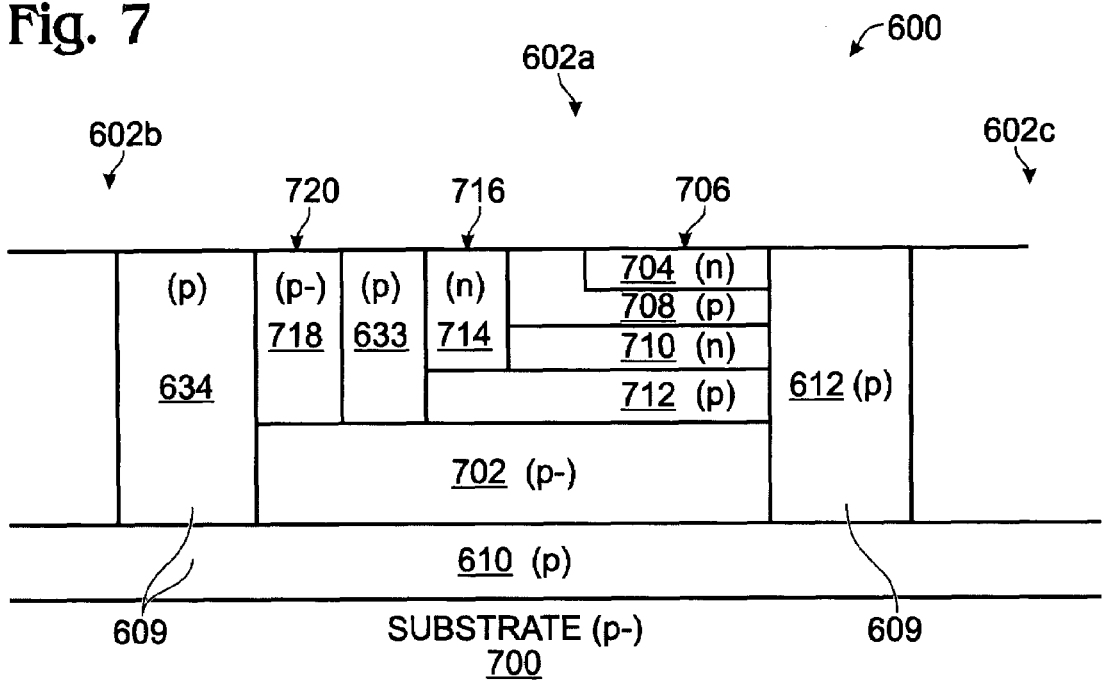
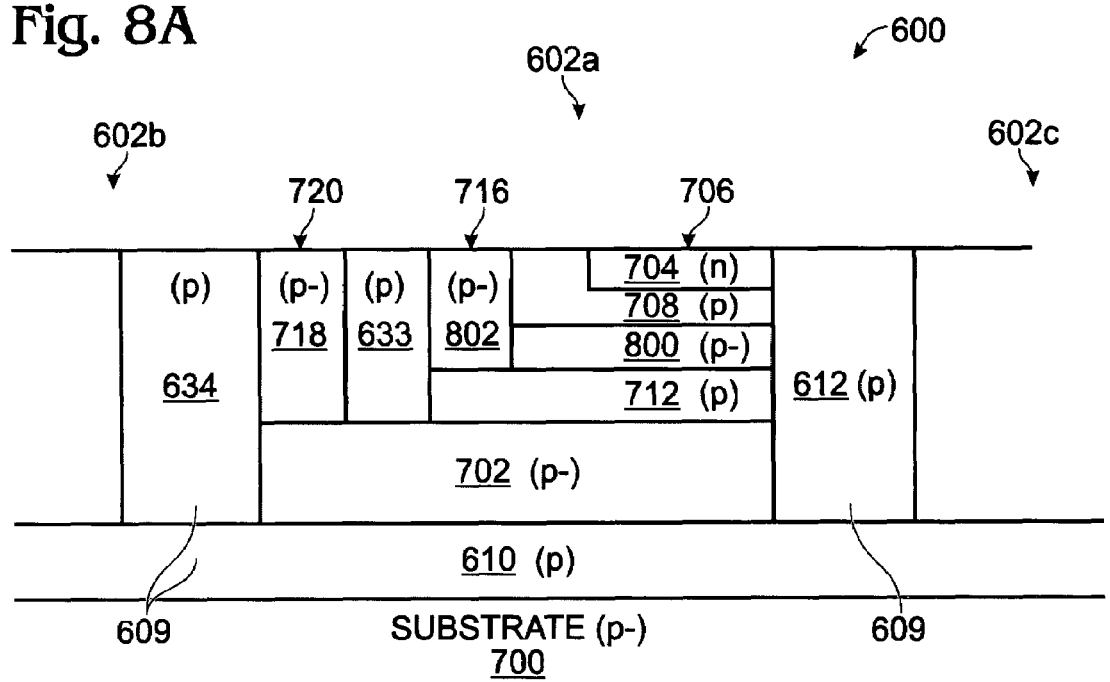

TO Fig. 14B

HIGH ENERGY IMPLANT PHOTODIODE STACK

BACKGROUND OF THE INVENTION

1. Field of the Invention

This invention generally relates to complementary metal/oxide/semiconductor (CMOS) imaging sensors and, more particularly, to a structure and associated fabrication process for using high energy ion implanting to form pixel diode sets and a well liner to isolate the photodiode sets in an array of photodiode sets.

2. Description of the Related Art

Silicon has characteristic photon absorption lengths that vary with the energy of the photons absorbed. For the wavelengths of 450 nanometers (nm), 550 nm, and 650 nm, the absorption lengths are 0.24 microns (µm), 1.13 µm, and 3.17 µm, respectively. This variation provides an opportunity to fabricate stacked diode junctions at depths that are capable of separating photons of various wavelengths, using standard CMOS manufacturing processes. Various technologies have been applied to this idea over the past 30 years and full color imaging is available in the market place.

FIG. 1 is a partial cross-sectional view of a stacked set of photodiodes formed in a Si-on-insulator (SOI) substrate (prior art). The photodiode set 100 includes three stacked photodiodes 102, 104, and 106. The blue color sensing photodiode (102) is fabricated on a silicon layer, while the green and red color sensing photodiodes (104 and 106, respectively) are fabricated in the Si substrate. The photodiode set is controlled by a transistor set, which is represented in this figure by transistor 108.

FIG. 2 is a schematic drawing depicting a triple cathode photodiode imager (prior art). In U.S. Pat. Nos. 6,727,521, 6,960,757, and 5,965,875 Merrill et al. disclose a filterless color CMOS imager cell having an n1/p1/n2/p2/n3/p-substrate structure. The pixel consists of five (5) junctions. All the p-type layers are grounded. The n1/p1 interface forms a junction for blue (B) diode. The green (G) diode is formed by the parallel combination of the n2/p1 and n2/p2 junctions. The red (R) diode is formed by the parallel combination of the n3/p2 and n3-p-substrate junctions. The n2/p1 and n2/p2 diodes have a common cathode and the anodes are all grounded. The triple-well technology of U.S. Pat. No. 5,965,875 requires large isolation area inside each pixel area.

The n-type layers are detector layers to collect photo-generated carriers, while the p-type layers are reference layers and are connected to common ground potential. The blue sensitive detector layer (n) at the surface of the silicon substrate has a reference layer (p) below it, while the green and red sensitive detector layers (n) have reference layers (p) above and below them. The electrical connection to the green and red sensitive detector layers are via the n-type plug formation. The structure of U.S. Pat. No. 6,727,521 promises a smaller pixel area because the lateral isolation area for the n-type plugs is much smaller than the triple well structures. However, to precisely locate the n-type detector layers and to confine the absorption layers for the respective R, G, and B light absorption and charge collection, two silicon epitaxial layers are required in the disclosed structure.

In U.S. Pat. No. 7,132,724, Merrill discloses three structures using conduction band alignment to fabricate a complete-charge-transfer detector with R, G, and B light absorption layers located at appropriate depths in the silicon substrate. All three structures are fabricated on p+silicon substrates, the junction between the R, G, B absorption layers and the reference layers are either p− to p+ junctions or n to p junctions. The location of the absorption layers (p− or n layer) in all three structures are controlled by the p-type reference layer formation by ion implantation. In order to fabricate the three disclosed devices on a p+ silicon substrate, the absorption layers (p− or n layer) must be formed by silicon epitaxial growth.

FIG. 3 is a partial cross-sectional view of device based upon the schematic of FIG. 2 (prior art). As in FIG. 2, the triple cathode device has an n/p/n/p/n/p layered structure with three p-layers connected to a common ground. The three n-layers are the cathodes for the blue, green, and red diodes, and are connected to their respective active pixel sensor (APS) circuits. One problem associated with this structure is its complicated process steps. Two silicon epitaxial (epi) processes and multiple ion implantations are needed. One epi layer is formed between the blue and green diode junctions, and another epi layer is formed between the green and red diode junctions. Additionally, there is no structure isolating the green and red diodes from the neighboring pixel set. This lack of isolation decreases the spatial resolution of the imager sensor.

FIG. 4 is a partial cross-sectional view of a triple cathode photodiode set with partial isolation (prior art). The p+ substrate prevents cross-talk between adjacent photodiode sets (not shown) through the underlying substrate. P doped regions 207 and 208 form a partial vertical wall. However, regions 201, 203, and 204, between 207 and 205, and between 208 and 205 are lightly p (p−) doped. This p/p−/p/p−/p/p−/p+(207-201-205-203-208-204-p+) structure forms electron channels in the p-areas (201, 203, and 204). Therefore, photo electrons in one pixel can diffuse to neighboring pixel. That is, although the pn depletion layer thickness does not extend to adjacent pixels, the electron diffusion length in the p layers is long, permitting photo electrons to be collected by adjacent pixels.

Digital camera technology is based upon the conflicting goals of increasing the pixel count, decreasing the chip size, and improving the signal-to-noise ratio. Higher pixel counts and smaller chip sizes mean that unit sensor area (the diode area) must be made smaller. When light strikes the diode, the photo electrons are generated and collected to the cathode. The photo electrons generate the signal. Undesirably, the signal-to-noise ratio decreases with smaller diode sizes, if the noise remains constant. One way to increase the signal is to use the area outside the diode to collect the photo electrons at the cathode. Regions 201, 203 and 204 are areas that extend outside the photodiode (past regions 207 and 208) that can absorb photons. Photo electrons generated in regions 201, 203 and 204 diffuse into the diode and are collected by the cathodes. Therefore, the signal is improved (increased). However, as described above, regions 201, 203 and 204 can be an electron channel between adjacent pixels, and degrade resolution.

Double junction and triple junction photodiodes with shared or independent color pixel sensor outputs are another solution to the above-mentioned problems. The process steps for these devices are much simpler than the triple cathode structure shown in FIG. 3. The separation of the blue, green, and red signals is performed by the APS circuit, and these three signals are integrated and readout sequentially. Therefore, the use of an external mechanical shutter for "still" shot imaging remains a problem. Additionally, the pixel size is relatively large because of the isolation required between pixels in an array.

FIG. 5 is a partial cross-sectional view of a triple cathode structure, fabricated without the use of an n/p/n/p/n/p layered structure, as proposed by Gergel et al. (prior art). Photo-generated electrons are collected on the cathode by the long electron diffusion length in the lightly p-typed doped layer. The separation of the blue, green, and red photon-generated electrons is by the $p^+$-p junction. Although BB_1 (Buried barrier) separates blue and green photon-generated electrons, and BB_2 separates green and red photon-generated electrons, there are no structures to completely prevent unintended electron flow through the substrate to neighboring red diode junctions.

It would be advantageous if a multi-junction photodiode color imager array could be fabricated with a minimum number of process steps, by eliminating the necessity of forming epitaxial Si layers.

SUMMARY

The present invention discloses a simple process integration method to fabricate vertically stacked photodiodes for R, G, and B light absorption and color imager fabrication. In one aspect, the initial silicon substrate is n-type, and the device is fabricated with n to p junction charge separation. In another aspect, the initial silicon substrate is p-type, and the device is fabricated with either n to p junction charge separation, or p– to p junction charge separation. More importantly, no silicon epitaxial (epi) layer is needed for simple and cost effective process integration.

Accordingly, an array of fully isolated multi-junction complimentary metal-oxide-semiconductor (CMOS) filterless color imager cells is provided. The color imager cell array is formed from a bulk silicon (Si) substrate without an overlying epitaxial Si layer. A plurality of color imager cells are formed in the bulk Si substrate, where each color imager cell includes a photodiode set and a U-shaped well liner. The photodiode set includes first, second, and third photodiodes formed as a stacked multi-junction structure, while the U-shaped well liner fully isolates the photodiode set from adjacent photodiode sets in the array.

The U-shaped well liner includes a physically interfacing doped well liner bottom and walls. The well liner bottom is interposed between the substrate and the photodiode set, and a first wall physically interfaces each doped layer of each photodiode in the photodiode set. Both the well liner bottom and the walls are p doped, and electrically connected to a reference voltage (i.e., ground).

In one aspect, the bulk Si substrate is n doped, and the third, bottom-most, photodiode includes an n doped layer physically interfaced to the well liner bottom. The first photodiode includes a first n doped layer formed in a top surface region, and an underlying first p doped layer, both physically interfacing the first wall. The second photodiode includes a second n doped layer underlying the first p doped layer, an underlying second p doped layer, both physically interfacing the first wall, and an n doped first vertical structure physically interfacing the second n doped layer to a top surface region. The third photodiode includes the second p doped layer, an underlying third n doped layer, both physically interfacing the first wall, and an n doped second vertical structure physically interfacing the third n doped layer to a top surface region.

Additional details of the above described device, variations of the device, and a method for forming an array of fully isolated multi-junction CMOS filterless color imager cells are provided below.

BRIEF DESCRIPTION OF THE DRAWINGS

FIG. 1 is a partial cross-sectional view of a stacked set of photodiodes formed in a Si-on-insulator (SOI) substrate (prior art).

FIG. 2 is a schematic drawing depicting a triple cathode photodiode imager (prior art).

FIG. 7 is a partial cross-sectional view of a first variation of the color imager cell array of FIG. 6.

FIG. 8A is a partial cross-sectional view of a second variation of the color imager cell array of FIG. 6.

DETAILED DESCRIPTION

Figure 3:
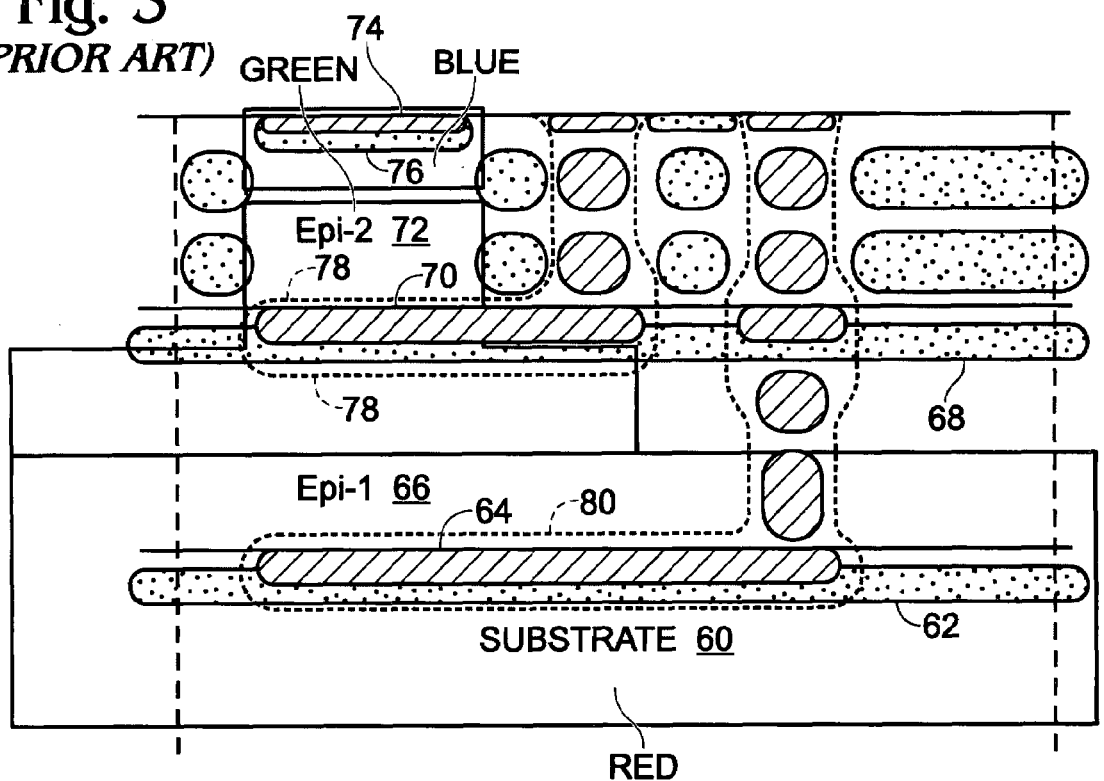
FIG. 3 is a partial cross-sectional view of device based upon the schematic of FIG. 2 (prior art).
Figure 4:
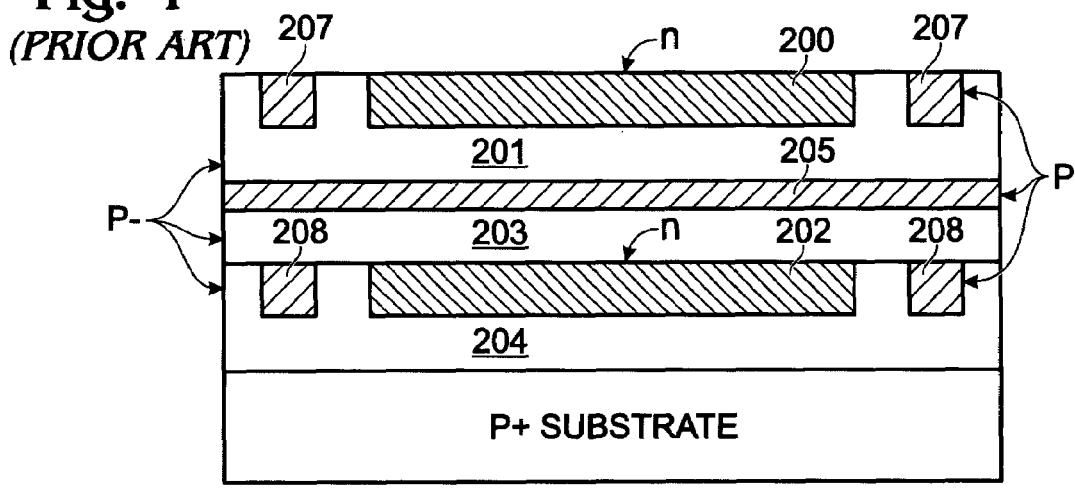
FIG. 4 is a partial cross-sectional view of a triple cathode photodiode set with partial isolation (prior art).
Figure 5:
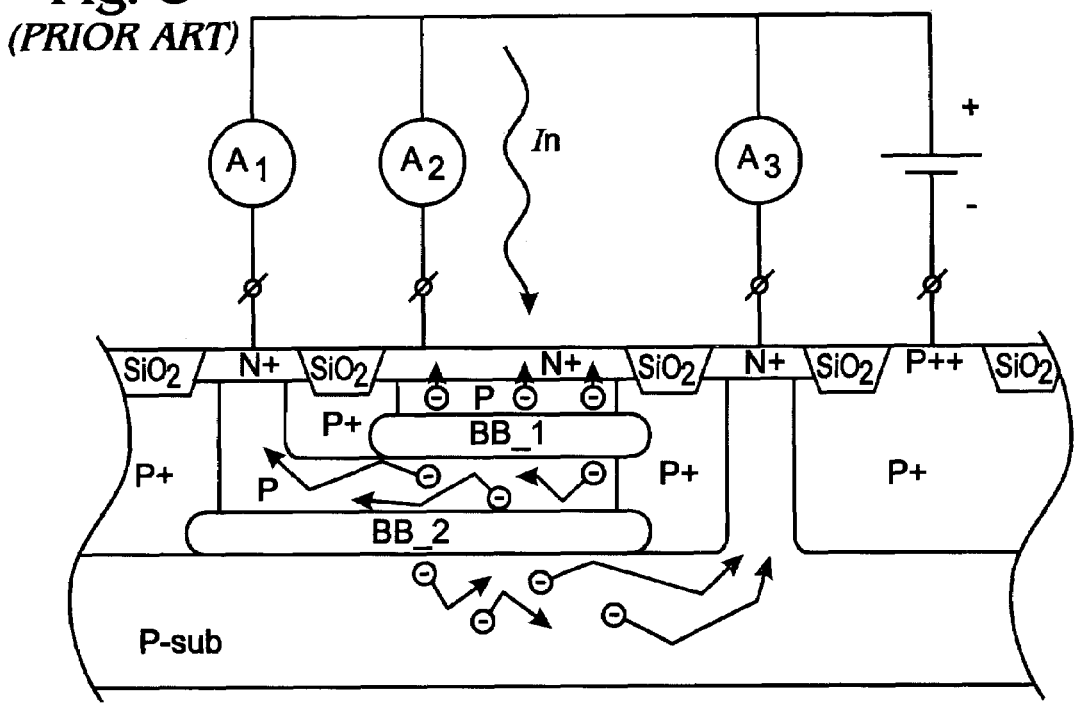
FIG. 5 is a partial cross-sectional view of a triple cathode structure, fabricated without the use of an n/p/n/p/n/p layered structure, as proposed by Gergel et al. (prior art).
Figure 6:
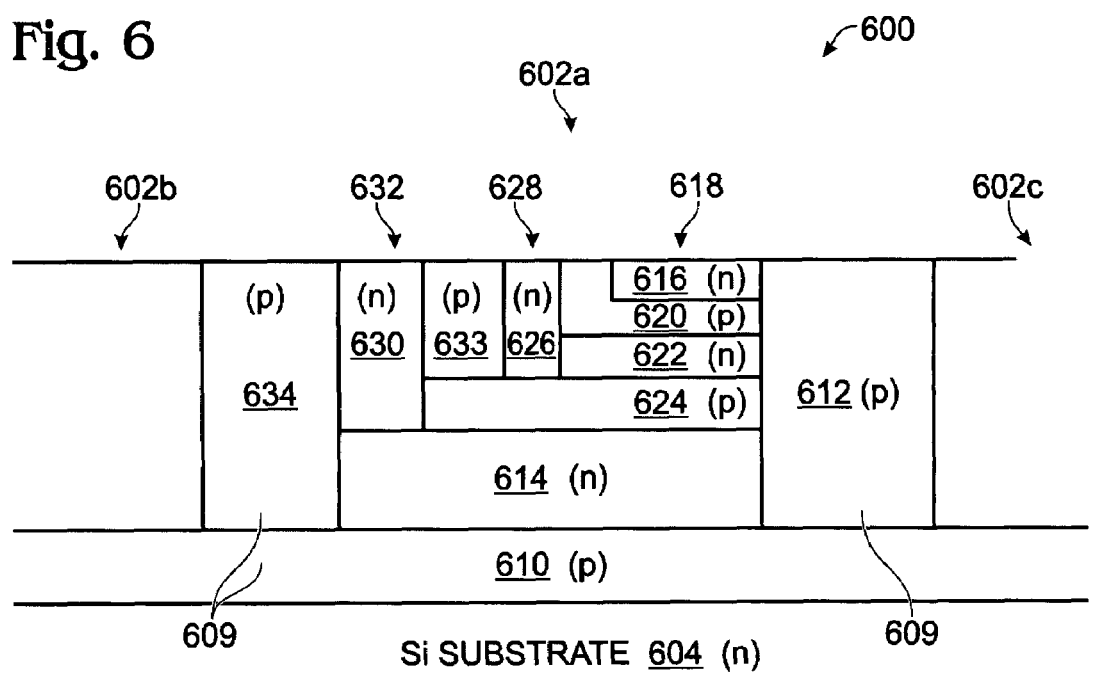
FIG. 6 is a partial cross-sectional view of an array of fully isolated multi-junction complimentary metal-oxide-semiconductor (CMOS) filterless color imager cells.

FIG. 6 is a partial cross-sectional view of an array 600 of fully isolated multi-junction complimentary metal-oxide-semiconductor (CMOS) filterless color imager cells 602. The color imager cell array 600 comprises a bulk silicon (Si) substrate 604 without an overlying epitaxial Si layer. A plurality of color imager cells are formed in the bulk Si substrate. Shown are cells 602a, 602b, and 602c. However, the array 600 is not limited to any particular number of cells. Although only three cells are shown, it should be understood that the array may be comprised of a much larger number cells configured in matrix, where each cell is identified by a position in a row and column. Although only a single cell from the array is detailed, it should be understood that the description of the cell (below) is applicable to every cell in the array.

Color imager cell 602a includes a photodiode set with a first photodiode, second photodiode, and third photodiode formed as a stacked multi-junction structure, as explained in more detail below. A U-shaped well liner 609 fully isolates the photodiode set from adjacent photodiode sets in the array. For example, the well liner 609 isolates the photodiode set of cell 602a from the photodiode set of cells 602b and 602c. Although the well liner 609 is depicted as having a U-shape in cross-section, it should be understood that if the cells are viewed in three dimensions, then the well liners would more closely resemble a cup-shape or a rectangle with a bottom.

The U-shaped well liner 609 includes a doped well liner bottom 610 interposed between the substrate 604 and the photodiode set. The U-shaped well liner includes a first wall 612 physically interfacing each doped layer of each photodiode in the photodiode set. The well liner bottom 610 is p doped, the first wall 612 is p doped, and both are electrically connected to a reference voltage (not shown). For example, the reference voltage can be ground or a dc voltage.

As shown, the bulk Si substrate 604 is n doped. The U-shaped well liner bottom 610 physically interfaces the first wall 612. The third, bottom-most, photodiode includes an n doped layer 614 physically interfaced to the well liner bottom 610. The first photodiode includes a first n doped layer 616 formed in a top surface 618, and an underlying first p doped layer 620, both physically interfacing the first wall 612. Alternately, layer 616 may be n+ doped. The second photodiode includes a second n doped layer 622 underlying the first p doped layer 620, an underlying second p doped layer 624, both physically interfacing the first wall 612. An n doped first vertical structure 626 physically interfaces the second n doped layer 622 to a top surface region 628.

The third photodiode includes the second p doped layer 624, and the underlying third n doped layer 614, both physically interfacing the first wall 612. An n doped second vertical structure 630 physically interfaces the third n doped layer 614 to a top surface region 632. The U-shaped well liner 609 includes a p doped second wall 634 physically interfacing the second vertical structure 630 and the well liner bottom 610. A p doped layer 633 separates the first vertical structure 626 from the second vertical structure 630.

As used herein, a heavily doped region, e.g., a heavily p doped region, is referred to as p+ (p+ doped), and is associated with dopant concentrations in the range of about $1 \times 10^{19}$ to $1 \times 10^{21}$ cm$^{-3}$. Regions with this degree of dopant are often contact areas. A moderately doped region, e.g., a moderately p doped region, is referred to as p (p doped or p-doped), and is associated with dopant concentrations in the range of about $5 \times 10^{16}$ to $1 \times 10^{19}$ cm$^{-3}$. A lightly doped region, e.g., a lightly p doped region, is referred to as p− (p− doped), and is associated with dopant concentrations in the range of about $1 \times 10^{15}$ to $5 \times 10^{16}$ cm$^{-3}$. For the n-type layers, a heavily n doped region is referred to as n+ (n+ doped) and is associated with dopant concentrations in the range of about $1 \times 10^{19}$ to $1 \times 10^{21}$ cm$^{-3}$. A moderately doped or lightly doped n region is referred to as n doped, and is associated with dopant concentrations in the range of about $1 \times 10^{15}$ to $1 \times 10^{19}$ cm$^{-3}$. The term "n-type" refers to any amount of n doping. Likewise, "p-type" refers to any level of p doping.

FIG. 7 is a partial cross-sectional view of a first variation of the color imager cell array of FIG. 6. In this aspect, the bulk Si substrate is p− doped. As is FIG. 6, the U-shaped well liner is p doped and the well liner bottom 610 physically interfaces the first wall 612 and the second wall 634. The third, bottom-most, photodiode includes a third diode p-doped layer 702 physically interfaced to the well liner bottom 610.

The first photodiode includes a first diode n doped layer 704 formed in a top surface region 706, and an underlying first p doped layer 708, both physically interfacing the first wall 612. Alternately, layer 704 may be n+ doped. The second photodiode includes a second diode doped layer 710 underlying the first p doped layer 708. The second diode layer 710 is n doped. A second p doped layer 712 underlies second diode doped layer 710, both physically interfacing the first wall 612. A first vertical structure 714 is n doped and physically interfaces the second diode doped layer 710 to a top surface region 716. The third photodiode includes the second p doped layer 712 and the underlying third diode p− doped layer 702, both physically interfaced to the first wall 612. A p− doped second vertical structure 718 physically interfaces the third diode p− doped layer 702 to a top surface region 720.

FIG. 8A is a partial cross-sectional view of a second variation of the color imager cell array of FIG. 6. In this aspect, the bulk Si substrate is p− doped. As is FIGS. 6 and 7, the U-shaped well liner is p doped and the well liner bottom 610 physically interfaces the first wall 612 and the second wall 634. The third, bottom-most, photodiode includes a third diode p− doped layer 702 physically interfaced to the well liner bottom 610.

The first photodiode includes a first diode n doped layer 704 formed in a top surface region 706, and an underlying first p+ doped layer 708, both physically interfacing the first wall 612. Alternately, layer 704 may be n+ doped. The second photodiode includes a second diode doped layer 800 underlying the first p doped layer 708. The second diode layer 800 is p− doped. A second p doped layer 712 underlies second diode doped layer 800, both physically interfacing the first wall 612. A first vertical structure 802 is p− doped and physically interfaces the second diode doped layer 800 to a top surface region 716. The third photodiode includes the second p doped layer 712 and the underlying third diode p− doped layer 702, both physically interfaced to the first wall 612. A p− doped second vertical structure 718 physically interfaces the third diode p− doped layer 702 to a top surface region 720.

Figure 8B:
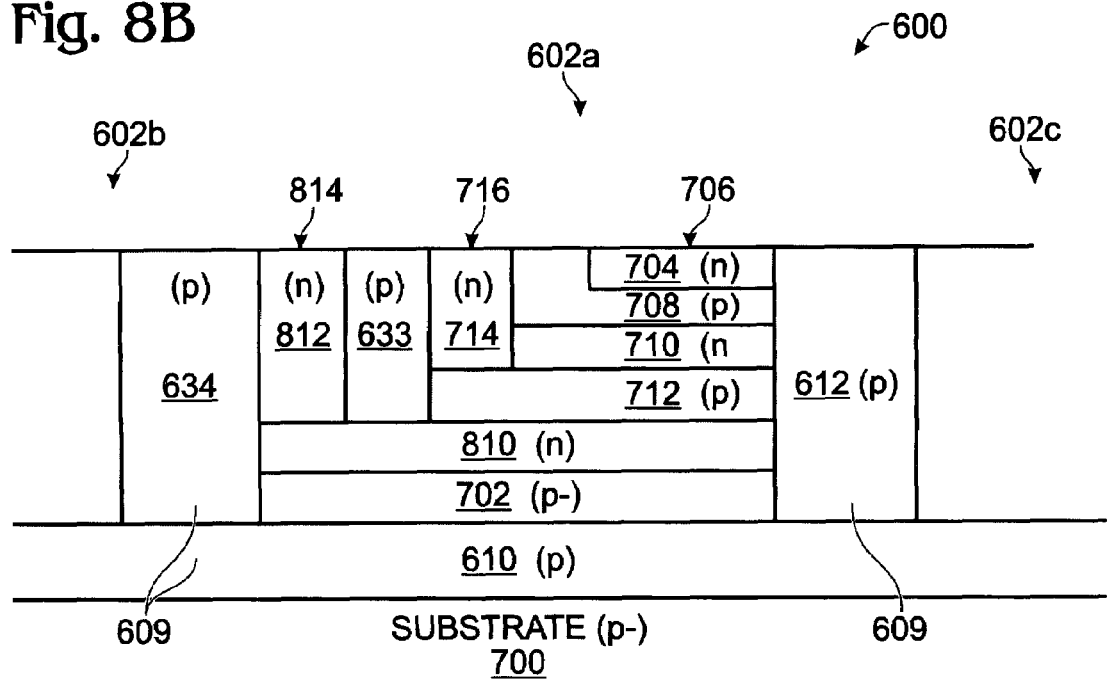
FIG. 8B is a partial cross-sectional view of a third variation of the color imager cell array of FIG. 6.

FIG. 8B is a partial cross-sectional view of a third variation of the color imager cell array of FIG. 6. In this aspect, the bulk Si substrate is p− doped. As is FIG. 6, the U-shaped well liner is p doped and the well liner bottom 610 physically interfaces the first wall 612 and the second wall 634. The third, bottom-most, photodiode includes a third diode p-doped layer 702 physically interfaced to the well liner bottom 610. A third n doped layer 810 overlies the p− doped layer 702.

The first photodiode includes a first diode n doped layer 704 formed in a top surface region 706, and an underlying first p doped layer 708, both physically interfacing the first wall 612. Alternately, layer 704 may be n+ doped. The second photodiode includes a second diode doped layer 710 underlying the first p doped layer 708. The second diode layer 710 is n doped. A second p doped layer 712 underlies second diode doped layer 710, both physically interfacing the first wall 612. A first vertical structure 714 is n doped and physically interfaces the second diode doped layer 710 to a top surface region 716. An n doped second vertical structure 812 physically interfaces the third n doped layer 810 to a top surface region 814.

It should be noted that the color imaging cells depicted in FIGS. 6 through 8B are fabricated without the necessity of depositing epitaxial Si layers, as described in more detail below. The use of integration processes that don't entail the deposition of an epitaxial silicon layer not only eliminate the extra steps of the epitaxial silicon process itself, but also eliminate the integration modules involving the wafer alignment mark preparations. For example, in order align structures in IC manufacturing, alignment marks must be printed on the silicon wafer prior to any patterned process. Usually, an alignment mark is processed by etching a pattern on silicon wafer, and subsequent processes reference this alignment mark. As well known, the silicon epitaxial growth rate is strongly dependent upon the exposed silicon crystallography faces. Since etched silicon alignment marks have many crystallography faces, the non-uniform silicon growth on the structured alignment marks results in unclear alignment marks after epitaxial silicon growth. To prevent this problem, an integration module that involves passivating the alignment mark prior to the epitaxial silicon growth, and cleaning the alignment mark surface after the epitaxial silicon growth, is needed. The elimination of the epitaxial silicon process and the alignment mark cleaning modules reduce the manufacturing cost of stacked photodiodes CMOS imager sensors.

Functional Description

FIGS. 9 through 12 depict steps in the fabrication of the color imaging cell array of FIG. 6. For a device with an n to p junction charge separation, the starting silicon substrate is n-type. The steps described below do not necessarily imply the process sequence. Additional process steps may be added to form a pinned photodiode for charge collection and complete charge transfer.

Figure 9:
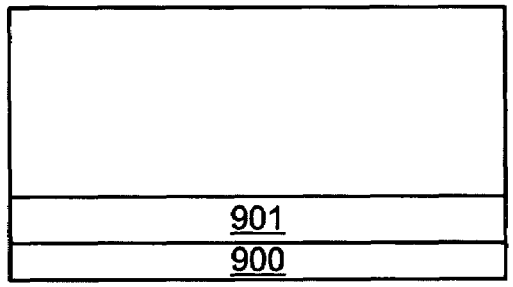
FIGS. 9 through 12 depict steps in the fabrication of the color imaging cell array of FIG. 6.
Figure 10:
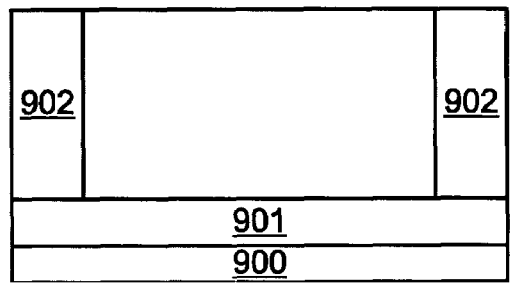

In FIG. 9 the process starts from an n-type silicon wafer (900) with a phosphorous concentration between 1e15 ($1\times10^{15}$) and 5e16 cm$^{-3}$. High energy boron ions are implanted at an energy of 2-4 MeV and dose between 1e12 to 5e13, to form a p layer (901) with a boron concentration between 5e16 to 1e19 cm$^{-3}$. The location of the p layer is about 2-5 micrometers (μm) below the n-type silicon surface. In FIG. 10, a p-type guard ring structure (902) is fabricated by multiple boron implantations to isolate the photodiode set. The p-type guard ring is electrically connected to the buried p layer. The guard ring structure has boron concentration between 5e16 and 1e19. A high voltage (1.5-4 MeV) boron implantation is needed to form an electrical connection between layer 901 and 902.

Figure 11:
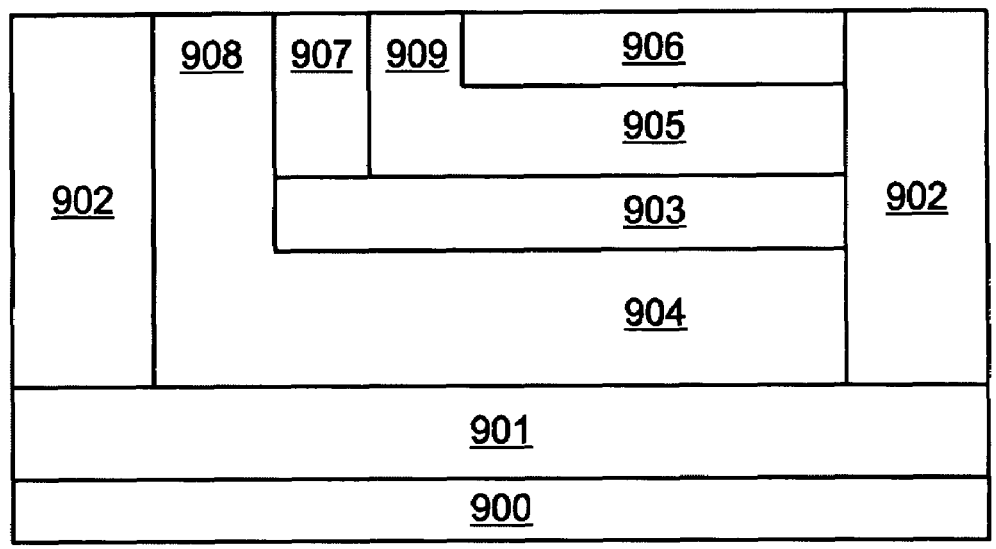

In FIG. 11 a p-type region 903 is formed by ion implantation below the silicon surface at a distance of ~0.9 to 1.5 μm. The boron concentration at this layer is between 5e16 to 1e19. This layer is sandwiched by two n-type layers 904 and 905. The pn junctions at 903 to 904, and 903 to 905 separate the red and green absorption regions. The 903 layer is electrically connected to layer 902 and connected to reference voltage (ground). No implantation is needed into layers 904 and 905. However, in some aspects, a phosphorous implantation into layer 905 may be performed to mitigate the chances of punch-through between layers 903 and 906. Also, in some aspects, a phosphorous implantation into the top portion of layer 904 may be performed to improve the photoelectron collection and to suppress the effect of the diffusion of boron from layer 903 into layer 904. The phosphorous dopant density at layer 904 is the same as in the silicon substrate (1e15 to 5e16 cm$^{-3}$), while the phosphorous density at layer 905 is between 1e16 to 5e17 cm$^{-3}$. Another p-type region 906 is formed by ion implantation on silicon surface. The depth of layer 906 is about 0.3 to 0.7 μm, and the boron density is between 5e16 and 1e19. This layer separates the blue and green photo electrons. P-type layer 907 is formed to isolate the green and red cathode conduction plugs (908 and 909, respectively).

Figure 12:
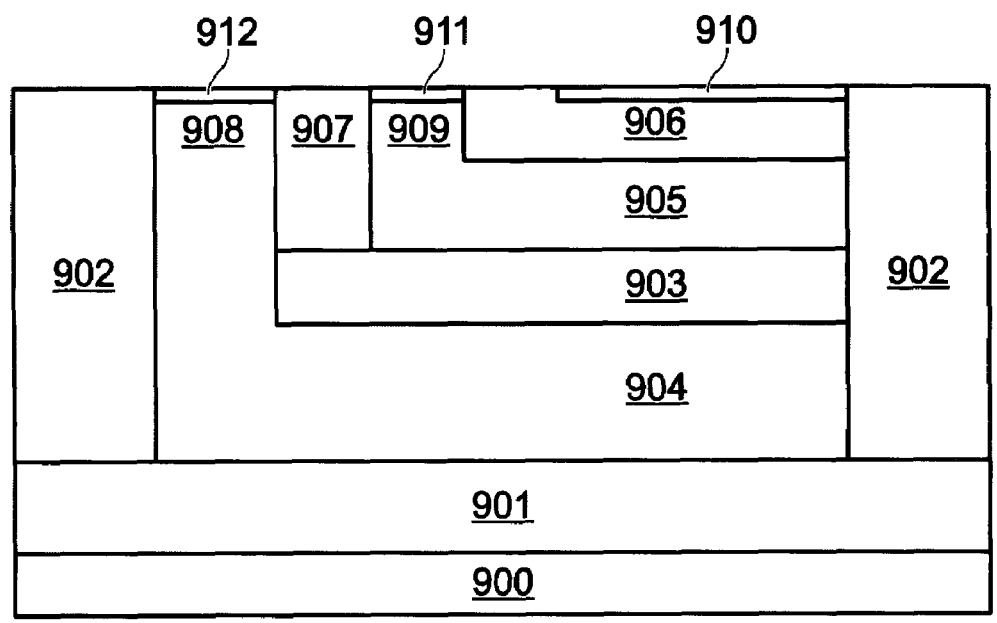

In FIG. 12 an n-type layer (910) is formed on the silicon surface. The pn junction formed between layers 910 and 906 forms a blue diode. The junction depth is about 0.1 to 0.3 μm from the silicon surface. The 911 and 912 layers are for the green and red cathode pick up, respectively. Although not shown, a p+ layer can form on top of 910 to form a buried photodiode or pinned photodiode. Similarly, p+ layers can form on top of layers 911 and 912 to form a buried photodiode structure for green and red diodes. Furthermore, multiple n-type implantations into regions 908 and 909 may be performed to improve the electron conduction.

For a device with p– to p junction charge separation, the starting silicon substrate is p-type. Although not specifically shown, the process and device structure are the same as described in FIGS. 9 through 12, except that layers 900, 904, 905, 908 and 909 are p-type layers with boron concentrations between 1e15 to 5e16. In another aspect, layers 900, 904, and 908 are p-type layers with boron concentrations between 1e15 to 5e16, while layer 905 and 909 are n doped. In yet another aspect, layers 905, 908 and 909 are n doped, except that the layer 900 is p-type with boron concentrations between 1e15 to 5e16 and that the layer 904 contains two layers with an n layer on top of a p–layer (see FIG. 8B). Note: the dosages, energies, dopant densities, and layer depths may vary from the above-mentioned values. Additional details of some of the above-mentioned implantation processes may be found in related pending application entitled, FULLY ISOLATED PHOTODIODE STACK, invented by Lee et al., Ser. No. 11/657,152, filed Jan. 24, 2007, which us incorporated herein by reference.

Figure 13:
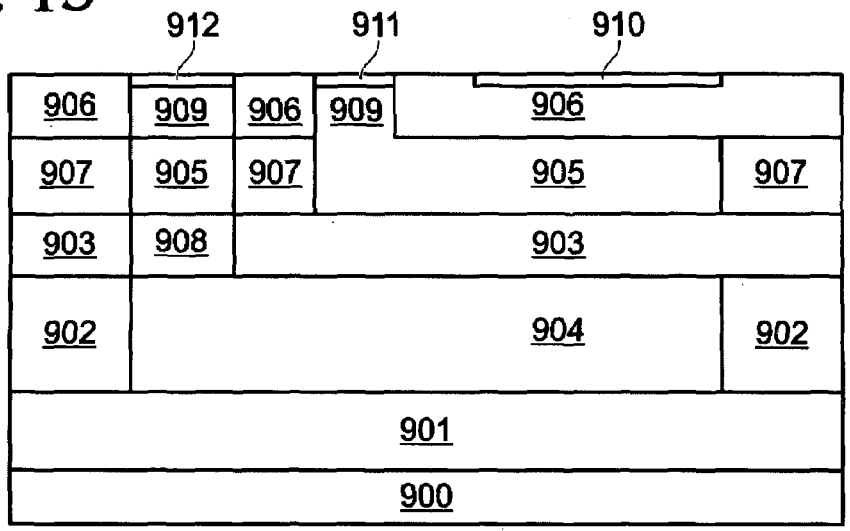
FIG. 13 is a partial cross-section view depicting a fourth variation of the color cell imager array shown in FIG. 6.

FIG. 13 is a partial cross-section view depicting a fourth variation of the color cell imager array shown in FIG. 6. The end structure is essentially the same as the structure of FIG. 6, except that some of the layers are formed without masking. For example, the vertical structure 908 of FIG. 12 is formed from the doping steps associated with layers 908, 905, and 909. Advantageously, the array is formed with fewer multiple ion implantation steps.

Figure 14A:
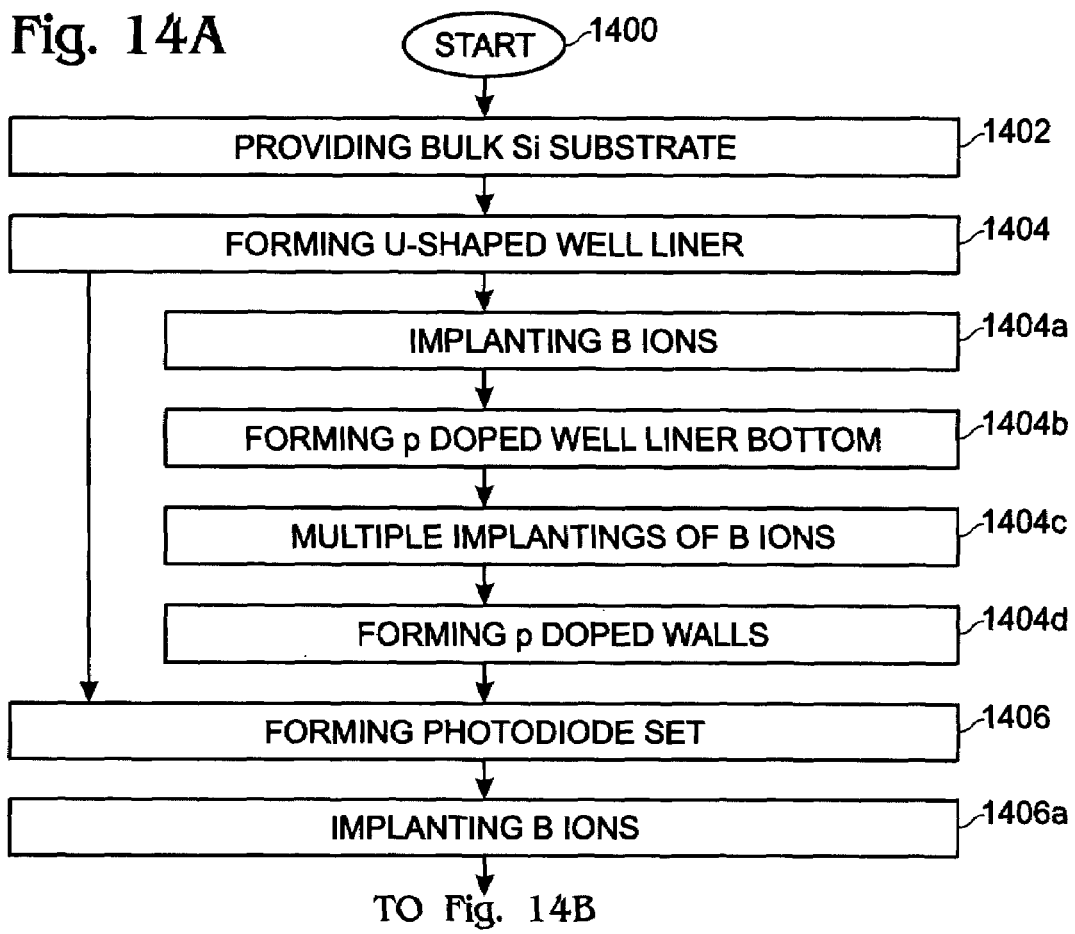
FIGS. 14A and 14B are flowcharts illustrating a method for forming an array of fully isolated multi-junction CMOS filterless color imager cells.
Figure 14B:
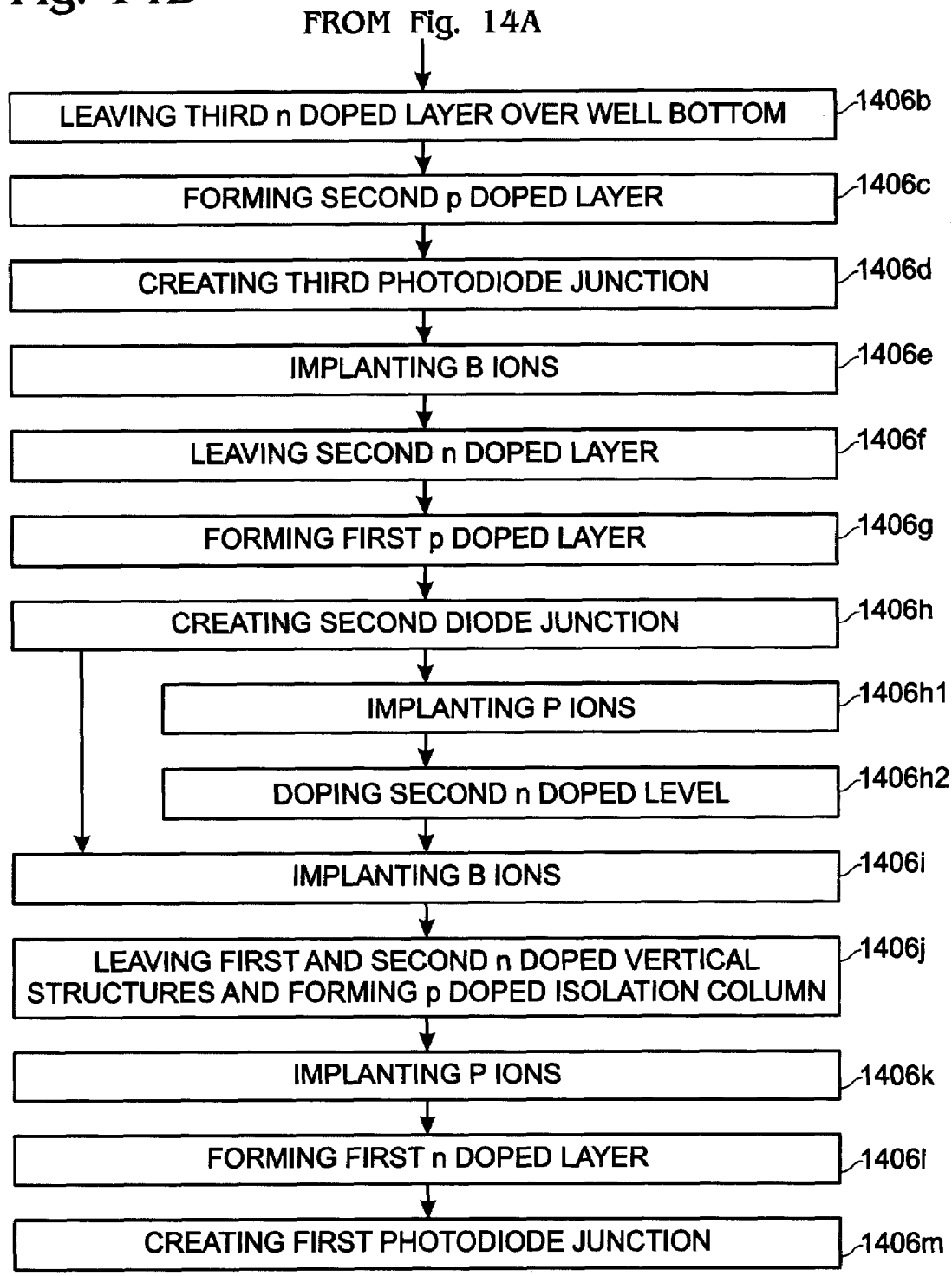

FIGS. 14A and 14B are flowcharts illustrating a method for forming an array of fully isolated multi-junction CMOS filterless color imager cells. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. The method starts at Step 1400.

Step 1402 provides a bulk Si substrate having a top surface, without an overlying epitaxial Si layer. Step 1404 forms a U-shaped well liner. Step 1406 forms a plurality of color imager cells, where each color imager cell includes a photodiode set with a first, second, and third photodiode formed as a stacked multi-junction structure. The U-shaped well liner fully formed in Step 1404 isolates the photodiode set from adjacent photodiode sets in the array.

In one aspect, forming the U-shaped well liner in Step 1404 includes substeps. Step 1404a implants dopants into the bulk Si substrate, and Step 1404b forms a doped well liner bottom interposed between the substrate and the photodiode set. For example, Step 1404a may implant boron (B) ions at an energy in a range of about 2 to 4 MeV and a dopant density in a range of about $5\times10^{16}$ to $1\times10^{19}$ per cubic centimeter (cm). Then, Step 1404b forms a p doped well liner bottom, about 2 to 5 micrometers below the substrate top surface. In another aspect, Step 1404c performs multiple B ion implants with the highest energy in a range of about 1.5 to 4 MeV. Other implanting steps may use an energy as low as 200 KeV. Step 1404d forms first and second p doped walls interfaced to the well liner bottom and a reference voltage.

In one example, Step 1402 provides a bulk Si substrate n doped with a phosphorous (P) concentration in a range of about $1\times10^{15}$ to $5\times10^{16}$ per cubic cm. Then, forming the photodiode set in Step 1406 includes forming a third, bottom-most photodiode with the following substeps. Step 1406a implants B ions, and Step 1406b leaves a third n doped layer overlying the well liner bottom. Step 1406c forms a second p doped layer overlying the third n doped layer, in the range of 0.9 to 1.5 micrometers below bulk Si substrate top surface. Step 1406d creates a third photodiode junction between the second p layer, the third n doped layer, and the p doped well liner bottom. In another aspect not shown, P ions can be implanted underlying the second p doped layer, creating a third n doped layer with additional P ions at the top of the third n doped layer. This improves the photoelectron collection and suppresses the effect of the diffusion of boron from the second p layer into the third n doped layer.

Forming the second photodiode includes the following substeps. Step 1406e implants B ions, and Step 1406f leaves a second n doped layer overlying the second p doped layer. Step 1406g forms a first p doped layer overlying the second n doped layer, in the range of 0.3 to 0.7 micrometers below bulk Si substrate top surface. Step 1406h creates a second photodiode junction between the first p doped layer, the second n doped layer, and the second p doped layer. In one aspect, Step 1406h1 implants with P ions, and Step 1406h2 dopes the second n doped level to a concentration in a range of about $1×10^{16}$ to $5×10^{17}$ per cubic cm.

In another aspect, Step 1406i implants B ions. Step 1406j leaves a first n doped vertical structure connecting the second n doped layer to the bulk Si substrate surface, and leaves a second n doped vertical structure connecting the third n doped layer to the bulk Si substrate surface. Step 1406j also forms a p doped isolation column separating the first and second vertical structures.

Forming the first photodiode includes the following substeps. Step 1406k implants P dopant ions. Step 1406l forms a first n doped layer in a range of about 0.1 to 0.3 micrometers below the bulk Si substrate top surface. Step 1406m creates a first photodiode junction between the first n doped layer and the first p doped layer.

Figure 15A:
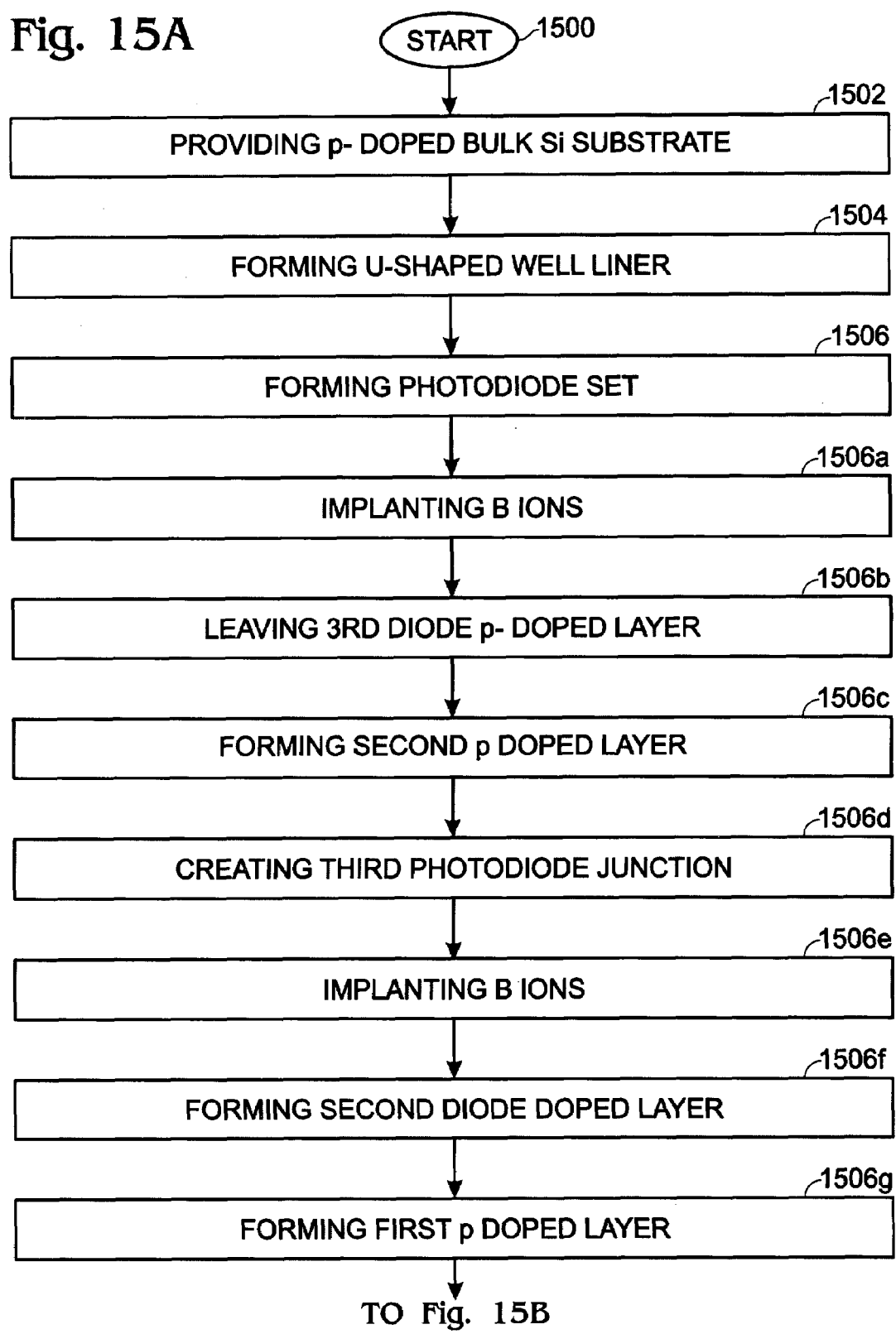
FIGS. 15A and 15B are flowcharts illustrating a variation in the method for forming an array of fully isolated multi-junction CMOS filterless color imager cells.
Figure 15B:
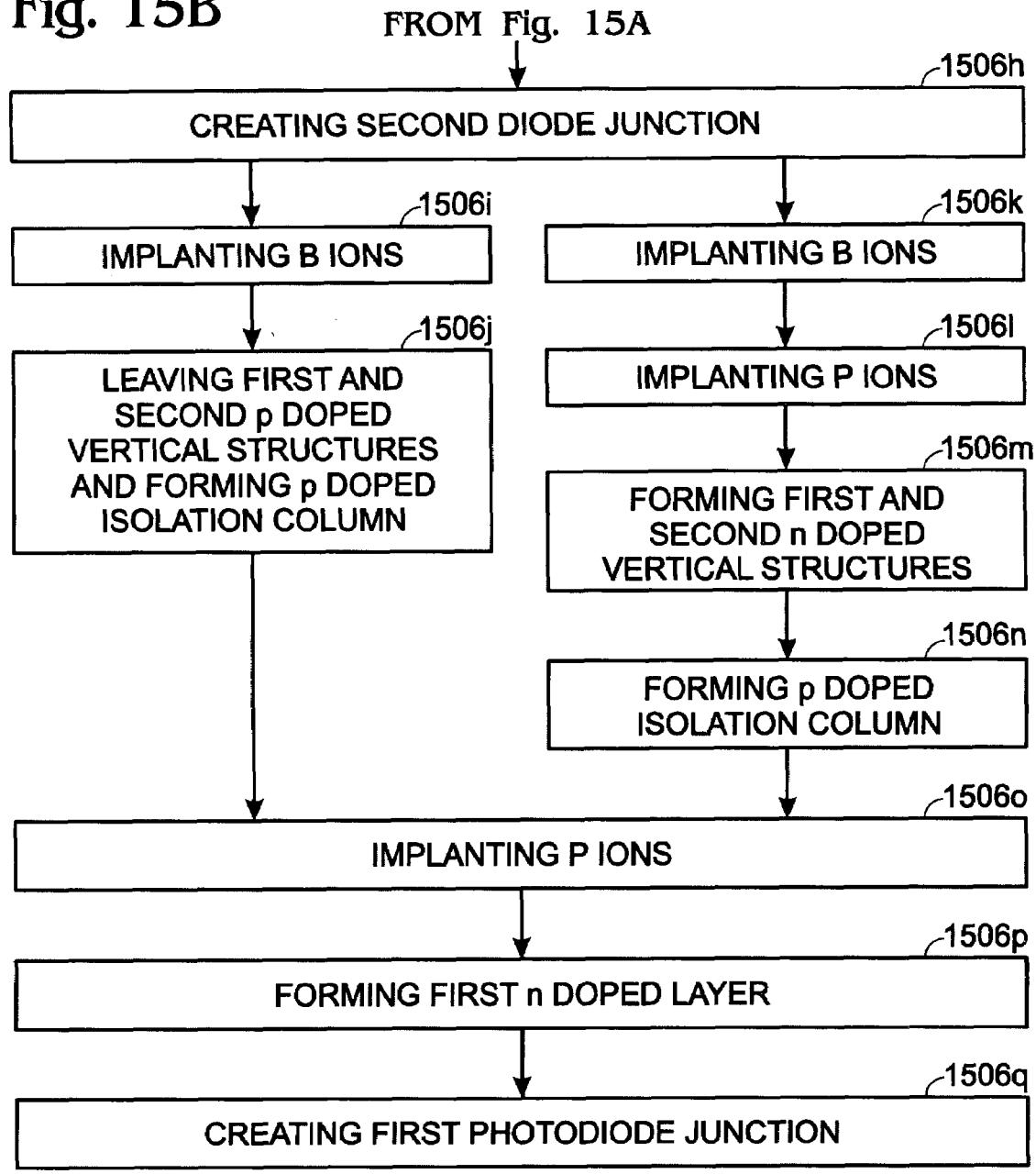

FIGS. 15A and 15B are flowcharts illustrating a variation in the method for forming an array of fully isolated multi-junction CMOS filterless color imager cells. The method starts at Step 1500. Step 1502 provides a bulk Si substrate p– doped with a B concentration in a range of about $1×10^{15}$ to $5×10^{16}$ per cubic cm. Step 1504 forms a U-shaped well liner, and Step 1506 forms a photodiode set. Forming a third, bottom-most photodiode includes the following substeps. Step 1506a implants B ions. Step 1506b leaves a third diode p– doped layer overlying the well liner bottom. Step 1506c forms a second p doped layer overlying the third diode p– doped layer, in the range of 0.9 to 1.5 micrometers below bulk Si substrate top surface. Step 1506d creates a third photodiode junction between the second p layer, the third diode p– doped layer, and the p doped well liner bottom.

Forming the second photodiode includes the following substeps. Step 1506e implants B ions. Step 1506f forms a second diode doped layer overlying the second p doped layer. The second diode doped layer is formed by either leaving a second diode p– doped layer overlying the second p doped layer, or implanting P ions and forming a second diode n doped layer overlying the second p doped layer. Step 1506g forms a first p doped layer overlying the second diode doped layer, in the range of 0.3 to 0.7 micrometers below bulk Si substrate top surface. Step 1506h creates a second photodiode junction between the first p doped layer, the second diode doped layer, and the second p doped layer.

If the second diode doped layer is p– doped, then Step 1506i implants B ions. Step 1506j leaves a first p– doped vertical structure connecting the second diode p– doped layer to the bulk Si substrate surface, and leaves a second p– doped vertical structure connecting the third diode p– doped layer to the bulk Si substrate surface. Step 1506j also forms a p doped isolation column separating the first and second vertical structures.

Alternately, if the second diode doped layer is n doped, Step 1506k implants B ions, leaving a second p– doped vertical structure connecting the third diode p– doped layer to the bulk Si substrate surface. Step 1506l implants P ions. Step 1506m forms a first n doped vertical structure connecting the second diode n doped layer to the bulk Si substrate surface, and Step 1506n forms a p doped isolation column separating the first and second vertical structures.

In another variation, the second diode doped layer is n doped, and Step 1506l implants P ions and forms a third n doped layer overlying the third diode p– doped layer. Step 1506m forms a first n doped vertical structure connecting the second diode n doped layer to the bulk Si substrate surface, and also forms a second n doped vertical structure connecting the third n doped layer to the bulk Si substrate surface. Step 1506k implants B ions, and Step 1506n forms a p doped isolation column separating the first and second vertical structures.

Forming the first photodiode includes the following substeps. Step 1506o implants P dopant ions. Step 1506p forms a first n doped layer in a range of about 0.1 to 0.3 micrometers below the bulk Si substrate top surface, and Step 1506q creates a first photodiode junction between the first n doped layer and the first p doped layer.

Some fully isolated multi-junction CMOS imager cell variations have been provided, fabricated in a bulk Si substrate using a high energy implanting process. Examples of particular dopant layered structures, types of dopants, dosages, concentrations, energies, and layer thickness have been presented to illustrate the invention. However, the invention is not limited to merely these examples. It will be appreciated that further variations and modifications thereof may be made within the scope of the invention as defined in the appended claims.

We claim:

1. A method for fabricating an array of fully isolated multi-junction complimentary metal-oxide-semiconductor (CMOS) filterless color imager cells, the method comprising:
   providing a bulk silicon (Si) substrate having a top surface, without an overlying epitaxial Si layer;
   forming a U-shaped well liner;
   forming a plurality of color imager cells, where each color imager cell includes a photodiode set with a first, second, and third photodiode formed as a stacked multi-junction structure; and,
   wherein forming the U-shaped well liner fully isolates the photodiode set from adjacent photodiode sets in the array by;
      implanting boron (B) ions into the bulk Si substrate at an energy in a range of about 2 to 4 million electronvolts (MeV) and a dopant density in a range of about $5×10^{16}$ to $1×10^{19}$ per cubic centimeter (cm); and,
      forming a p doped well liner bottom, interposed between the substrate and the photodiode set, about 2 to 5 micrometers below the substrate top surface.

2. The method of claim 1 wherein forming the U-shaped well includes:
   performing multiple B ion implants, with a highest implant energy in a range of about 1.5 to 4 MeV;
   forming first and second p doped walls interfaced to the well liner bottom and a reference voltage.

3. The method of claim 1 wherein providing the bulk Si substrate includes providing a bulk Si substrate n doped with a phosphorous (P) concentration in a range of about $1×10^{15}$ to $5×10^{16}$ per cubic cm.

4. The method of claim 3 wherein forming the photodiode set includes forming a third, bottom-most photodiode as follows:
   implanting B ions;
   leaving a third n doped layer overlying the well liner bottom;
   forming a second p doped layer overlying the third n doped layer, in the range of 0.9 to 1.5 micrometers below bulk Si substrate top surface; and,
   creating a third photodiode junction between the second p layer, the third n doped layer, and the p doped well liner bottom.

5. The method of claim 4 wherein forming the photodiode set includes forming a second photodiode as follows:
   implanting B ions;
   leaving a second n doped layer overlying the second p doped layer;

forming a first p doped layer overlying the second n doped layer, in the range of 0.3 to 0.7 micrometers below bulk Si substrate top surface; and, creating a second photodiode junction between the first p doped layer, the second n doped layer, and second p doped layer.

6. The method of claim 5 wherein forming the second photodiode includes:

implanting with P ions;

doping the second n doped level to a concentration in a range of about $1\times10^{16}$ to $5\times10^{17}$ per cubic cm.

7. The method of claim 5 wherein forming the photodiode set includes:

implanting B ions;

leaving a first n doped vertical structure connecting the second n doped layer to the bulk Si substrate surface;

leaving a second n doped vertical structure connecting the third n doped layer to the bulk Si substrate surface; and forming a p doped isolation column separating the first and second vertical structures.

8. The method of claim 7 wherein forming the photodiode set includes forming a first photodiode as follows:

implanting P ions;

forming a first n doped layer in a range of about 0.1 to 0.3 micrometers below the bulk Si substrate top surface; and, creating a first photodiode junction between the first n doped layer and the first p doped layer.

9. The method of claim 1 wherein providing the bulk Si substrate includes providing a bulk Si substrate p– doped with a B concentration in a range of about $1\times10^{15}$ to $5\times10^{16}$ per cubic cm.

10. The method of claim 9 wherein forming the photodiode set includes forming a third, bottom-most photodiode as follows:

implanting B ions;

leaving a third diode p– doped layer overlying the well liner bottom;

forming a second p doped layer overlying the third diode p– doped layer, in the range of 0.9 to 1.5 micrometers below bulk Si substrate top surface; and, creating a third photodiode junction between the second p layer, the third diode p– doped layer, and the p doped well liner bottom.

11. The method of claim 10 wherein forming the photodiode set includes forming a second photodiode as follows:

implanting B ions;

forming a second diode doped layer overlying the second p doped layer;

forming a first p doped layer overlying the second diode doped layer, in the range of 0.3 to 0.7 micrometers below bulk Si substrate top surface; and, creating a second photodiode junction between the first p doped layer, second diode doped layer, and the second p doped layer.

12. The method of claim 11 wherein forming the second diode doped layer includes using a process selected from a group consisting of:

leaving a second diode p– doped layer overlying the second p doped layer; and, implanting P ions and forming a second diode n doped layer overlying the second p doped layer.

13. The method of claim 11 wherein the second diode doped layer is p doped, and forming the photodiode set includes:

implanting B ions;

leaving a first p– doped vertical structure connecting the second diode p– doped layer to the bulk Si substrate surface;

leaving a second p– doped vertical structure connecting the third diode p– doped layer to the bulk Si substrate surface; and forming a p doped isolation column separating the first and second vertical structures.

14. The method of claim 11 wherein the second diode doped layer is n doped, and forming the photodiode set includes:

implanting B ions;

leaving a second p– doped vertical structure connecting the third diode p– doped layer to the bulk Si substrate surface;

implanting P ions;

forming a first n doped vertical structure connecting the second diode n doped layer to the bulk Si substrate surface; and, forming a p doped isolation column separating the first and second vertical structures.

15. The method of claim 11 wherein the second diode doped layer is n doped, and forming the third includes:

implanting P ions;

forming a third n doped layer overlying the third diode p– doped layer;

forming a first n doped vertical structure connecting the second diode n doped layer to the bulk Si substrate surface; and, forming a second n doped vertical structure connecting the third n doped layer to the bulk Si substrate surface;

implanting B ions; and, forming a p doped isolation column separating the first and second vertical structures.

16. The method of claim 11 wherein forming the photodiode set includes forming a first photodiode as follows:

implanting P ions;

forming a first n doped layer in a range of about 0.1 to 0.3 micrometers below the bulk Si substrate top surface; and, creating a first photodiode junction between the first n doped layer and the first p doped layer.

* * * * *